United States Patent
Nakanishi

(10) Patent No.: US 8,994,252 B2
(45) Date of Patent: Mar. 31, 2015

(54) QUARTZ PLATE AND QUARTZ RESONATOR IN WHICH THE QUARTZ PLATE IS USED

(75) Inventor: Kentaro Nakanishi, Kakogawa (JP)

(73) Assignee: Daishinku Corporation, Hyogo (JP)

( * ) Notice: Subject to any disclaimer, the term of this patent is extended or adjusted under 35 U.S.C. 154(b) by 301 days.

(21) Appl. No.: 13/540,196

(22) Filed: Jul. 2, 2012

(65) Prior Publication Data

US 2013/0009521 A1    Jan. 10, 2013

(30) Foreign Application Priority Data

Jul. 4, 2011   (JP) .................................. 2011-148024
May 8, 2012   (JP) .................................. 2012-106441

(51) Int. Cl.
*H01L 41/09* (2006.01)
*H03H 9/10* (2006.01)
*H03H 9/19* (2006.01)

(52) U.S. Cl.
CPC .............. *H03H 9/1021* (2013.01); *H03H 9/19* (2013.01)
USPC ............................ 310/365; 310/320; 310/368

(58) Field of Classification Search
USPC .......... 310/320, 361, 368, 367, 365, 348, 344
See application file for complete search history.

(56) References Cited

U.S. PATENT DOCUMENTS

| 4,449,395 A | * | 5/1984 | Kurtz et al. | 73/54.11 |
| 4,499,395 A | * | 2/1985 | Kahan | 310/361 |
| 4,642,511 A | * | 2/1987 | Chason et al. | 310/348 |
| 5,376,861 A | * | 12/1994 | Nakamura et al. | 310/361 |
| 6,114,801 A | * | 9/2000 | Tanaka et al. | 310/365 |

FOREIGN PATENT DOCUMENTS

| JP | 2003-347886 | * | 5/2003 | H03H 9/215 |
| JP | 2003-347886 | * | 12/2003 | H03H 9/215 |
| JP | 2007-335941 | | 12/2007 | |
| JP | 2008-118685 | | 5/2008 | |

* cited by examiner

*Primary Examiner* — Thomas Dougherty
*Assistant Examiner* — Karen B Addison
(74) *Attorney, Agent, or Firm* — McDermott Will & Emery LLP

(57) ABSTRACT

An AT-cut quartz plate having chamfered ridge portions and an almost rectangular shape in planar view, wherein a resonance frequency is equal to or larger than 7 MHz and equal to or smaller than 9 MHz, lengths of long and short sides of the rectangular shape are equal to or larger than 1.5 mm and equal to or smaller than 2.4 mm, and equal to or larger than a frequency difference between primary vibration and sub-vibration is equal to or larger than 975 kHz and equal to or smaller than 1,015 kHz.

9 Claims, 15 Drawing Sheets

QUARTZ PLATE AND QUARTZ RESONATOR IN WHICH THE QUARTZ PLATE IS USED

BACKGROUND OF THE INVENTION

1. Field of the Invention

The invention relates to a quartz plate used in a quartz resonator or a quartz device such as a quartz oscillator, and a quartz resonator in which the quartz plate is used.

2. Description of the Related Art

An AT-cut quartz resonator is an electronic device used for various purposes, for example, it is often used in communication tools. The AT-cut quartz resonator, when loaded in vehicles, is used as a timing device which creates a reference frequency of ECU (electronic control unit). As substrates of the ECU are dimensionally smaller in recent years, an installation space of the quartz resonator is increasingly narrowed.

The quartz resonator should be thin, outside dimensions of which conventionally required are, for example, about 3.2 mm in length×2.5 in width. A low frequency, 8.000 MHz, for example is used as the ECU reference frequency.

An AT-cut quartz plate has an oscillation frequency in reverse proportion to its own thickness dimension, meaning that the quartz plate has a larger thickness as the frequency is lower. Therefore, a quartz plate for such a low frequency as 8.000 MHz has a larger thickness than a quartz plate for a higher frequency.

Usually, the quartz resonator has a structure where end portions of the quartz plate are bonded with, for example, an adhesive in a container to be supported therein. Because of larger thicknesses of the quartz plate in the band of low frequencies, the end portions of the quartz plate are conventionally chamfered (generally called beveling work) to attenuate a vibration energy generated in an area of the container where the quartz plate is supported and to obtain favorable series resistance values by enclosing the vibration energy under driving electrodes formed in center portions of front and back surfaces of the quartz plate.

To subject the quartz plate to the beveling work, an abrasive and the quartz plate are sealed in a working chamber. A plurality of the working chambers thus containing the abrasive and the quartz plate are set in a high-speed rotary tank to leverage a centrifugal force generated when the working chambers thus set are rotated at high speeds.

A shape of the beveled quartz plate (bevel shape) is reflected on resonance waveforms. More specifically, frequencies of primary vibration (resonance) and sub-vibration (unwanted vibration) of the quartz plate are variable depending on the progress of the beveling work. Therefore, the bevel shape can be suitably controlled by confirming positions (frequencies) of the primary and sub-vibrations using, for example, a network analyzer.

The patent references, JP Patent No. 2075046, JP Patent No. 4623321, and the specification of Unexamined Japanese Patent Applications Laid-Open No. 2007-335941 disclose the quartz plates controlled based on frequency differences between the primary vibration and sub-vibration and the beveling work management method.

The frequency of the primary vibration of the AT-cut quartz plate disclosed in the specification is 26 MHz, therefore, the quartz plate according to the invention is thinner than the 8-MHz quartz plate. On the other hand, a quartz plate, wherein the primary vibration frequency is 8 MHz, is as thick as about 208 µm which is three times larger than the thickness of the 26-MHz quartz plate.

With such an increasing thickness of the quartz plate, it becomes more important to attenuate the vibration energy by suitably beveling the quartz plate. Therefore, characteristics of the bevel shape have a larger impact on the quartz plate wherein the frequency of the primary vibration is 8 MHz (low frequency) than the quartz plate wherein the frequency of the primary vibration is 26 MHz.

For instance, the series resistance value is 500Ω or larger in a quartz plate that can be housed in a surface mounting quartz resonator wherein outer dimensions in planar view are 3.2 mm in length×2.5 mm in width and the primary vibration frequency is 8 MHz. Thus, it was difficult to find a bevel shape suitable for achieving desirable series resistance values, and no quantitative index for reliably reproducing such a suitable bevel shape was available.

SUMMARY OF THE INVENTION

Therefore, the invention provides a quartz plate which fulfills the demand for downsizing and achieves favorable characteristics, and a quartz resonator in which the quartz plate is used.

A quartz plate according to the invention has chamfered ridge portions and an almost rectangular shape in planar view, wherein a resonance frequency is equal to or larger than 7 MHz and equal to or smaller than 9 MHz, lengths of long and short sides of the rectangular shape are equal to or larger than 1.5 mm and equal to or smaller than 2.4 mm, and sub-vibration is present in a range of frequencies higher than a range of frequencies of primary vibration by equal to or larger than 975 kHz and equal to or smaller than 1,015 kHz.

Preferably, the sub-vibration is present in a range of frequencies higher than a range of frequencies of primary vibration by equal to or larger than 995 kHz and equal to or smaller than 1,015 kHz.

Preferably, the long sides of the quartz plate are set in a direction of Z' axis thereof and the short sides of the quartz plate are set in a direction of X axis thereof.

Preferably, the lengths of the long sides of the quartz plate are equal to or larger than 2.1 mm and equal to or smaller than 2.4 mm, and the lengths of the short sides of the quartz plate are equal to or larger than 1.5 mm and equal to or smaller than 1.75 mm.

Preferably, the lengths of the short sides of the quartz plate are equal to or larger than 1.61 mm and equal to or smaller than 1.75 mm.

The sub-vibration present in the quartz plate includes a plurality of sub-vibrations.

For example, the sub-vibration includes a first sub-vibration and a second sub-vibration. The first sub-vibration is a sub-vibration having a frequency higher than and most approximate to that of the primary vibration (unwanted vibration). The second sub-vibration is a sub-vibration having a frequency higher than that of the first sub-vibration and second most approximate to that of the primary vibration next to the first sub-vibration.

According to the above definition, the sub-vibration having a frequency different to that of the primary vibration by equal to or larger than 460 kHz and equal to or smaller than 480 kHz is the first sub-vibration, and the sub-vibration having a frequency different to that of the primary vibration by equal to or larger than 995 kHz and equal to or smaller than 1,015 kHz is the second sub-vibration.

The first and second sub-vibrations respectively have different oscillation modes depending on the setting of the quartz plate in an axial direction. When, for example, the X axis of quartz is set in a direction of long sides of the quartz plate, the Z' axis of quartz is set in a direction of short sides thereof, and the Y axis of quartz is set in a direction of thickness thereof, the first sub-vibration results in a third-order inharmonic vibration in the direction of X, while the second sub-vibration results in a first-order inharmonic vibration in the direction of X.

When, for example, the Z' axis of quartz is set in the direction of long sides of the quartz plate, the X axis of quartz is set in the direction of short sides thereof, and the Y axis of quartz is set in the direction of thickness thereof, the first sub-vibration results in a first-order inharmonic vibration in the direction of X, while the second sub-vibration is a third-order inharmonic vibration in the direction of X.

The inventors of the invention found out that a quartz plate having favorable characteristics can be obtained when the quartz plate is subjected to a beveling work so that the frequency difference between the primary vibration and the first sub-vibration is equal to or larger than 460 kHz and equal to or smaller than 480 kHz and/or the frequency difference between the primary vibration and the second sub-vibration is equal to or larger than 975 kHz and equal to or smaller than 1,015 kHz.

When one or both of the first sub-vibration and the second sub-vibration are controlled so that the frequency difference between the primary vibration and the first sub-vibration is equal to or larger than 460 kHz and equal to or smaller than 480 kHz or the frequency difference between the primary vibration and the second sub-vibration is equal to or larger than 975 kHz and equal to or smaller than 1,015 kHz, the quartz plate having favorable characteristics can ensure a good shape reproducibility. Further, these numeral ranges can be leveraged as quantitative control indices for stabilizing the bevel shape reproducibility of the quartz plate.

The invention, wherein the quartz plate is subjected to the beveling work so that at least the frequency difference between the primary vibration and the second sub-vibration is equal to or larger than 975 kHz and equal to or smaller than 1,015 kHz or preferably equal to or larger than 995 kHz and equal to or smaller than 1,015 kHz, can produce a quartz plate having favorable characteristics. The invention can further obtain favorable series resistance values and remarkable frequency-temperature characteristics in a quartz resonator in which the quartz plate is used.

In the case where the quartz plate has an inappropriate bevel shape, not only the series resistance values of the quartz plate are deteriorated (increased), but also a frequency variability responding to temperature changes (frequency-temperature characteristics) is thereby adversely affected.

When the quartz plate according to the invention is used in a quartz resonator, the quartz resonator can accomplish favorable series resistance values and remarkable frequency-temperature characteristics because a particular shape of the quartz plate having favorable characteristics can be reliably reproduced by focusing on the second sub-vibration having a better stability.

Preferably, the long sides are set in the direction of Z' axis and the short sides are set in the direction of X axis in the quartz plate according to the invention.

The invention, wherein the long sides of the quartz plate are set in the direction of Z' axis, can provide a quartz resonator having more stable frequency-temperature characteristics. More specifically describing the technical advantage of the invention, when end portions on the short sides of the quartz plate are bonded to inside of the container with the long sides thereof being set in the direction of Z' axis and the short sides thereof being set in the direction of X axis, the primary vibration and contour vibration of the quartz plate are more effectively prevented from being combined than when the long sides of the quartz plate are set in the direction of X axis.

In the event that the primary vibration and contour vibration of the quartz plate are combined, a large frequency variation (generally called frequency jump), and/or a large variation of series resistance values possibly occurs. However, when the quartz plate according to the invention, wherein the primary vibration and contour vibration are effectively prevented from being combined, is used, a quartz resonator having favorable characteristics can be obtained.

Preferably, the lengths of the long sides set in the direction of Z' axis are equal to or larger than 2.1 mm and equal to or smaller than 2.4 mm.

Preferably, the length of the long sides set in the direction of Z' axis are equal to or larger than 2.19 mm and equal to or smaller than 2.21 mm.

The quartz resonator according to the invention is structurally characterized in that driving electrodes and connection electrodes led out from the driving electrodes toward at least one end side of the quartz plate are formed on front and back surfaces of the quartz plate. The quartz resonator is housed in the container so that the connection electrodes are bonded to mounting electrodes of the container in an electrically conductive manner.

The quartz resonator in which the quartz plate is used can achieve favorable series resistance values and remarkable frequency-temperature characteristics.

As described thus far, the invention can provide a quartz plate fulfilling the demand for downsizing and achieving favorable characteristics because of its appropriate bevel shape thereof, and a quartz resonator in which the quartz plate is used. The invention thus technically advantageous is applicable to mass production of piezoelectric vibrators.

These and other objects as well as advantages of the invention will become clear by the following description of an exemplary embodiment of the invention. A number of benefits not recited in this specification will come to the attention of the skilled in the art upon implementing the invention.

BRIEF DESCRIPTION OF THE DRAWINGS

FIG. 11a is a plan view of the quartz plate according to the invention.

FIG. 11b is a sectional view of the quartz plate cut along Line B-B of FIG. 11a.

DETAILED DESCRIPTION OF THE INVENTION

Hereinafter, an exemplary embodiment of the invention is described in detail referring to the accompanied drawings. The exemplary embodiment describes an example in which the invention is applied to a surface mounting quartz resonator. The quartz resonator described in the exemplary embodiment has a rectangular shape in planar view, and outer dimensions thereof are 3.2 mm in length×2.5 mm in width.

Figure 1:
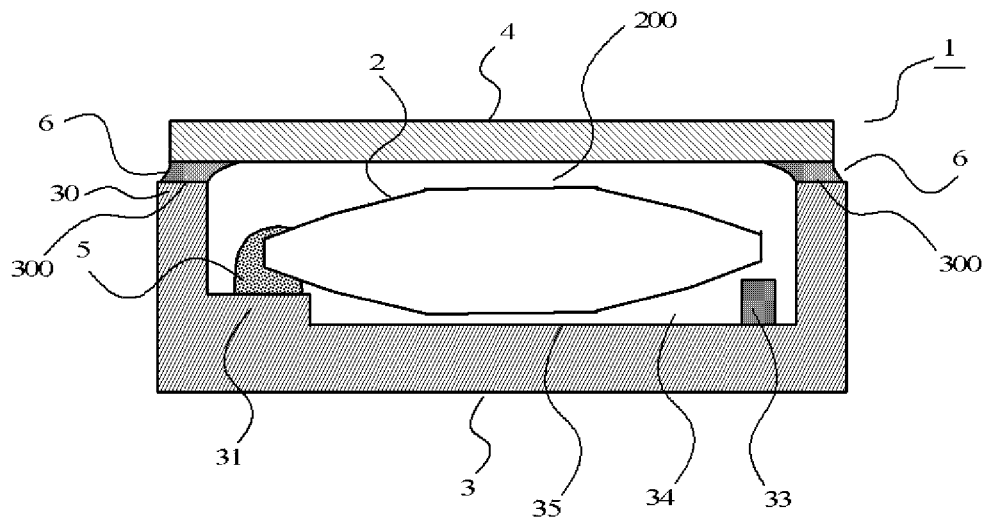
FIG. 1 is a sectional view of a quartz resonator in a direction of long sides thereof according to an exemplary embodiment of the invention.

FIG. 1 is a sectional view of a quartz resonator in a direction of long sides thereof according to the exemplary embodiment. Referring to FIG. 1, a quartz resonator 1 has a quartz plate 2 having a rectangular shape in planar view, a base (container) 3 having a hollowed shape in cross section, and a cover 4 having a flat-plate shape. The resonance frequency (nominal frequency) of the quartz resonator according to the exemplary embodiment is 8.000 MHz in fundamental vibration mode. The quartz plate 2 is bonded to inside of the base 3 having a hollowed shape in cross section with a jointing material 5. The cover 4 is bonded to an opening of the base with a jointing material 6.

The cover 4 is made from a ceramic material having a rectangular shape in planar view. An wall upper surface of the base 3 is joined with a lower surface of the cover 4, and a sealing material (not illustrated in the drawing) is formed on the joint-surface side. A low-melting glass is used as the sealing material. Other than the ceramic material, kovar may be used as a base material of the cover 4, wherein a nickel plating layer and a gold plating layer are formed thereon.

When the cover 4 is thus structured, the sealing material to be used is preferably a metallic brazing material such as an An—Sn alloy.

Figure 2:
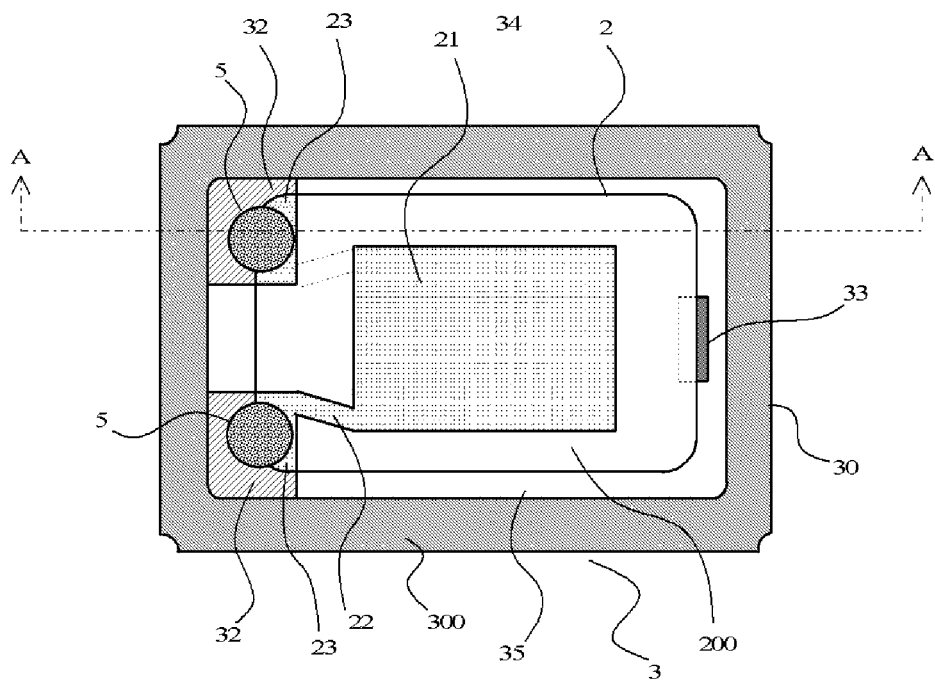
FIG. 2 is a plan view of the quartz resonator of FIG. 1 from which a cover 4 has been removed.

Referring to FIG. 2, the base 3 used in the exemplary embodiment is described. FIG. 2 is a plan view of the illustration of FIG. 1 from which the cover 4 has been removed. The base 3 has a rectangular box shape in planar view where a hollow portion 34 is formed so as to open upward. The base 3 is a laminate member where ceramic green sheets are plurally multilayered. After internal wiring conductors are printed at predefined positions, the ceramic green sheet layers are located and stacked on each other and then fired to be integrally formed. A wall portion 30 is formed in an annular shape around the hollow portion 34. The upper surface 300 of the wall portion 30 is flattened. A pair of step portions 31 and 31 are collaterally formed on an inner bottom surface 35 of the hollow portion 34.

A pair of mounting electrodes 32 and 32 formed from metallic films are formed on upper surfaces of the paired step portions 31 and 31. Describing the layer structure of the mounting electrode 32, the upper surface of the stepped portion 31 is tungsten-metalized, and the resulting surface is then nickel-plated and then gold-plated.

The mounting electrodes 32 are electrically connected to external connection electrodes (not illustrated in the drawings) formed on a bottom surface (back surface) of the base 3 through the wiring conductors (not illustrated in the drawings) formed in the base 3.

The mounting electrodes 32 and the external connection electrodes may be electrically connected by forming conductors vertically in outer-peripheral corner portions of the base 3 (generally called castellation).

Referring to FIG. 2, a pad portion 33 having a rectangular parallelepiped shape is formed from the same material as that of the base 3 on the inner bottom surface 35 of the hollow portion 34. The pad portion 33 is formed at a position where a free-end edge portion of the quartz plate overlaps with the pad portion 33 in planar view. The pad portion formed at the position can prevent any contact between the free-end edge portion of the quartz plate 2 and the inner bottom surface 35 when, for example, a large impact is applied from outside to the quartz resonator (see FIG. 3).

Figure 3:
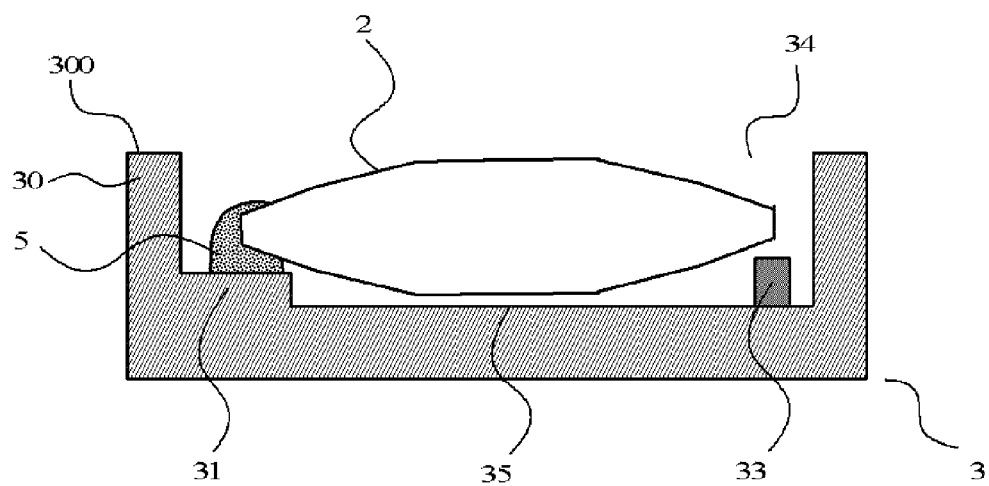
FIG. 3 is a sectional view cut along Line A-A of FIG. 2.

The quartz plate used in the exemplary embodiment is described referring to FIGS. 1 to 3. The quartz plate 2 is a AT-cut quartz piece cut out in a predefined rectangular shape in planar view. The long sides of the quartz plate 2 are 2.220 mm, and the short sides thereof are 1.620 mm. A pair of driving electrodes 21 and 21 facing each other are formed to drive the quartz plate on front and back main surfaces 200 of the quartz plate 2, and lead-out electrodes 22 and 22 are led out from the driving electrodes 21 and 21 (see FIG. 2, the lead-out electrodes 22 electrodes are not illustrated in FIGS. 1 and 3).

A pair of connection electrodes 23 and 23 connected to the lead-out electrodes 22 led out from the driving electrodes 21 are formed on edge portions of the quartz plate 2 on one end side thereof. The connection electrodes 23 are placed on and joined with the respective mounting electrodes 32 by applying a jointing material 4 to between the electrodes. An example of the jointing material 4 is a silicone-based resin jointing material having an electrical conductivity, however, the jointing material 4 is not necessarily limited to the silicone-based resin jointing material having an electrical conductivity. The jointing material 4 may be an epoxy-based resin jointing material having an electrical conductivity or a metallic bump in place of the resin-containing jointing materials.

Figure 4:
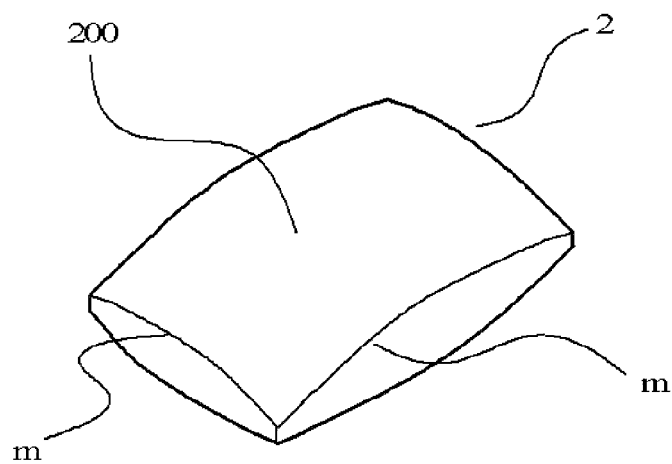
FIG. 4 is a perspective view of a quartz plate according to the exemplary embodiment.
Figure 4:
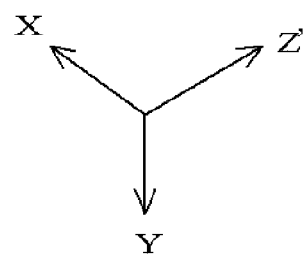
Figure 5:
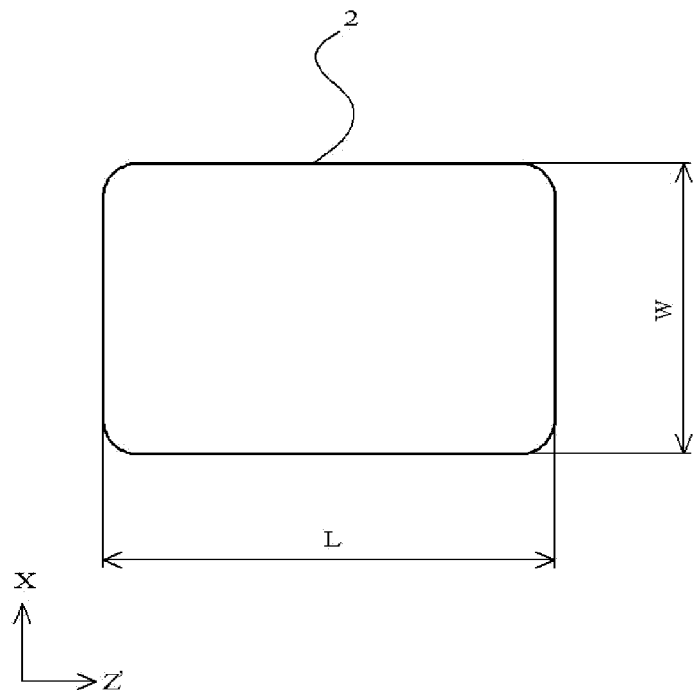
FIG. 5 is a plan view of the quartz plate according to the exemplary embodiment.

The quartz plate 2 is described below in further detail. FIG. 4 is a perspective view of the quartz plate according to the exemplary embodiment, and FIG. 5 is a plan view of the quartz plate according to the exemplary embodiment.

An end surface of the quartz plate 2 is subjected to a beveling work. The beveling work chamfers ridge portions m of the quartz plate 2. The quartz plate 2 has a thickness increasingly smaller toward end portions of long sides L and short sides W thereof. The quartz plate 2 thus structurally characterized has a sectional shape similar to a biconvex lens as illustrated in FIG. 4.

According to the exemplary embodiment, Z' axis of quartz is set in a direction of long sides of the quartz plate 2, X axis of quartz is set in a direction of short sides thereof, and Y axis of quartz is set in a direction of thickness thereof.

Figure 6:
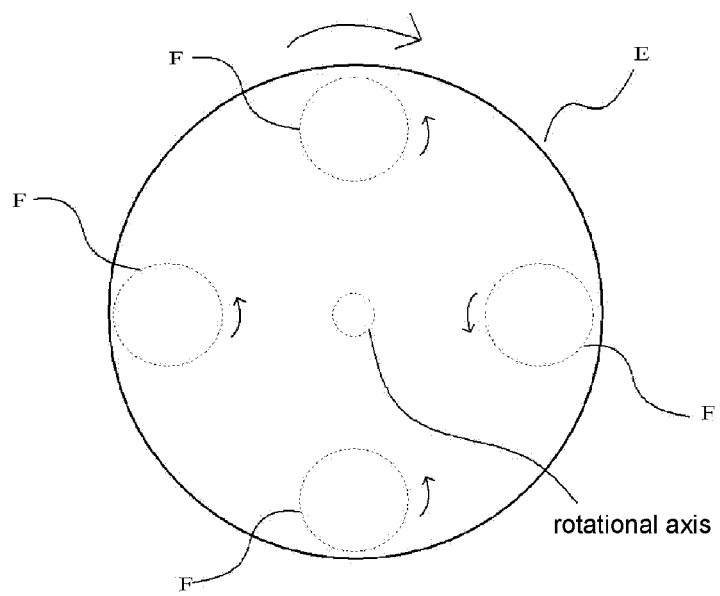
FIG. 6 is a schematic sectional view of a beveling device for the quartz plate according to the invention.

The process of beveling work applied to the quartz plate 2 is described. FIG. 6 is a schematic sectional view of a beveling device used for the quartz plate according to the invention. Prior to the beveling work, a given number of quartz plates having a rectangular parallelepiped shape and a given volume of abrasive are mixedly sealed in a working chamber.

Then, the working chambers are plurally housed in each of rotary tanks (F). The rotary tanks are spaced at equal intervals on an outer circumference of a drum E. When the drum E is rotated in a direction, the rotary tanks rotate in a direction reverse to the rotational direction of the drum E. As the drum is rotating, the ridge portions of the quartz plate are cut off by a friction generated between the ridge portions and an inner wall surface of the working chamber and an abrasion caused by the abrasive. Then, a curved inner wall surface of the working chamber (curvature) is transferred to the quartz plate.

Because the AT-cut quartz plate has a limited area dimension, there are a plurality of unwanted vibrations (generally called sub-vibrations) other than vibration originally intended (primary vibration) due to reflected wave transmitted from the contour of the quartz plate undergoing thickness slip vibration and contour vibration resulting from contour dimensions.

Figure 7:
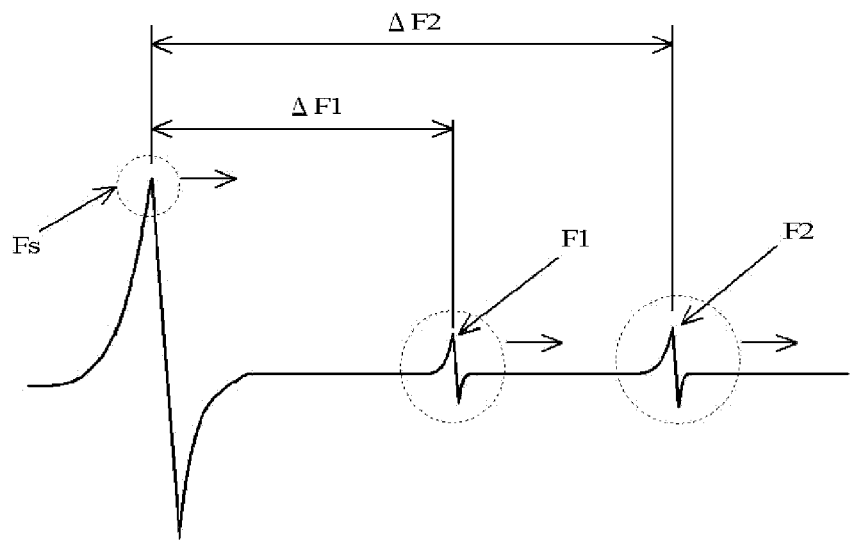
FIG. 7 is an illustration of a relationship between primary vibration and sub-vibration of the quartz plate.

Of the plurality of sub-vibrations, two sub-vibrations approximate to the primary vibration are particularly illustrated in FIG. 7. FIG. 7 schematically illustrates a resonance waveform obtained when the quartz plate is measured by a network analyzer. In the illustration of FIG. 7, F1 is the frequency of a first sub-vibration, and F2 is the frequency of a second sub-vibration.

The frequency (F1) of the first sub-vibration is higher than the frequency (Fs) of the primary vibration, and the first sub-vibration is most approximate to the primary vibration frequency-wise.

The frequency (F2) of the second sub-vibration is higher than the frequency (F1) of the first sub-vibration, and the second sub-vibration is most approximate to the primary vibration frequency-wise next to the first sub-vibration.

According to the exemplary embodiment, the Z' axis of quartz is set in the direction of long sides of the quartz plate, the X axis of quartz is set in the direction of short sides thereof, and the Y axis of quartz is set in the direction of thickness thereof. Therefore, the first sub-vibration results in a first-order inharmonic vibration in the direction of X, while the second sub-vibration results in a third-order inharmonic vibration in the direction of X.

In general, as the beveling work advances, the frequencies of the first and second sub-vibrations are elevated. Though the frequency of the primary vibration is elevated as well, there is an increasing difference between the frequencies of the primary vibration and the sub-vibrations as the beveling work advances because of different rates of elevation of the frequencies of the primary vibration and the sub-vibrations.

Figure 8:
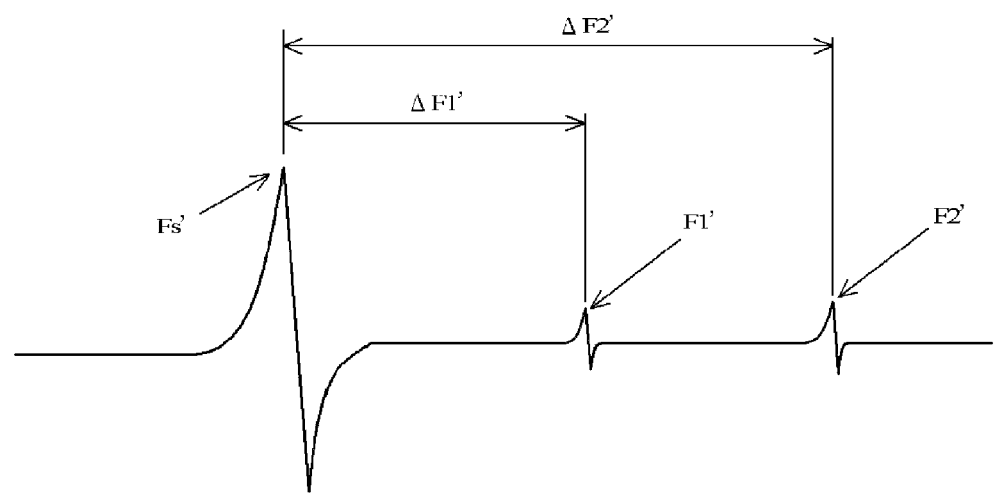
FIG. 8 is an illustration of a relationship between primary vibration and sub-vibration of the quartz plate.

The increasing difference between the frequencies is described referring to FIGS. 7 and 8. As illustrated in FIG. 7, a frequency difference between the first sub-vibration (F1) and the primary vibration (Fs) at a time point is $\Delta F1$, and a frequency difference between the second sub-vibration (F2) and the primary vibration (Fs) at a time point is $\Delta F2$.

As illustrated in FIG. 8, $\Delta F1 < \Delta F1'$, and $\Delta F2 < \Delta F2'$ ($\Delta F1' = F1' - Fs'$, $\Delta F2' = F2' - Fs'$), where the frequency of the first sub-vibration is F1', the frequency of the second sub-vibration is F2', and the primary vibration is Fs' after a given length of time $\Delta t$.

Figure 9:
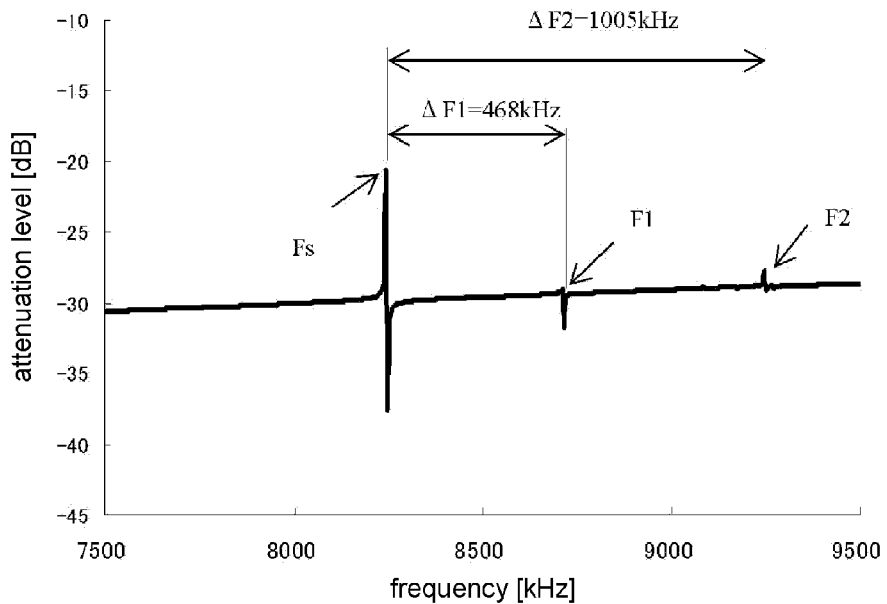
FIG. 9 is a graphical illustration of a relationship between primary vibration and sub-vibration of the quartz plate according to the exemplary embodiment.
Figure 10:
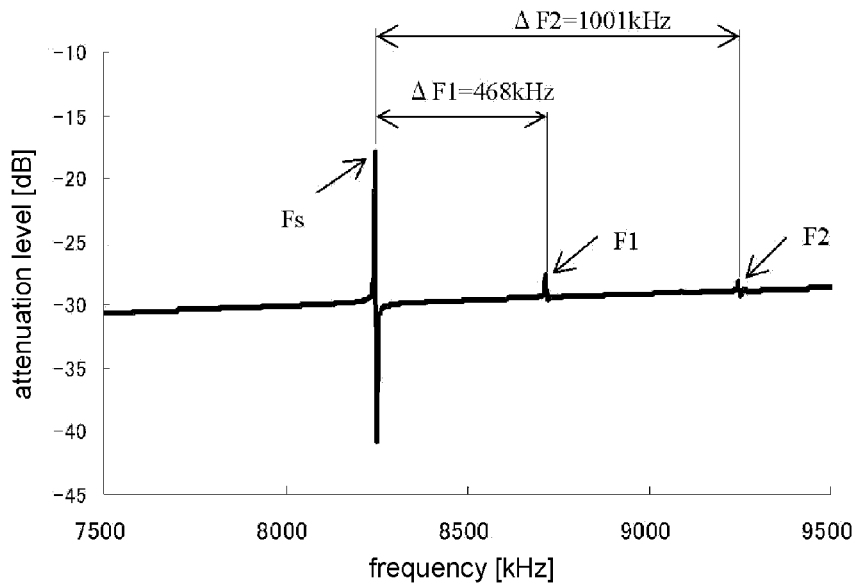
FIG. 10 is a graphical illustration of a relationship between primary vibration and sub-vibration of the quartz plate according to the exemplary embodiment.

FIGS. 9 and 10 are graphical illustrations of relationships between the primary vibration and the sub-vibrations of the after beveling quartz plate according to the exemplary embodiment. Referring to FIG. 9, the frequency difference ($\Delta F1$) between the primary vibration (Fs) and the first sub-vibration (F1) is 468 kHz, and the frequency difference ($\Delta F2$) between the primary vibration (Fs) and the second sub-vibration (F2) is 1,005 kHz.

Referring to FIG. 10, the frequency difference ($\Delta F1$) between the primary vibration (Fs) and the first sub-vibration (F1) is 468 kHz, and the frequency difference ($\Delta F2$) between the primary vibration (Fs) and the second sub-vibration (F2) is 1,001 kHz.

When the quartz plate is subjected to the beveling work so that one or both of the followings is fulfilled; the frequency difference ($\Delta F1$) between the primary vibration (Fs) and the first sub-vibration (F1) is equal to or larger than 460 kHz and equal to or smaller than 480 kHz, and the frequency difference ($\Delta F2$) between the primary vibration (Fs) and the second sub-vibration (F2) is equal to or larger than 995 kHz and equal to or smaller than 1,015 kHz, the quartz plate thereby obtained have favorable characteristics.

When the frequencies of the primary vibration and the first and second sub-vibrations are monitored so as to meet the numeral ranges, the numeral ranges can be leveraged as quantitative control indices for stabilizing the bevel shape reproducibility of the quartz plate.

The quartz plate according to the invention, when subjected to the beveling work so that one or both of the frequency differences between the primary vibration and the first and second sub-vibrations are included in the respective numeral ranges, the shape of the quartz plate thereby obtained also meets the following requirement.

Figure 11:
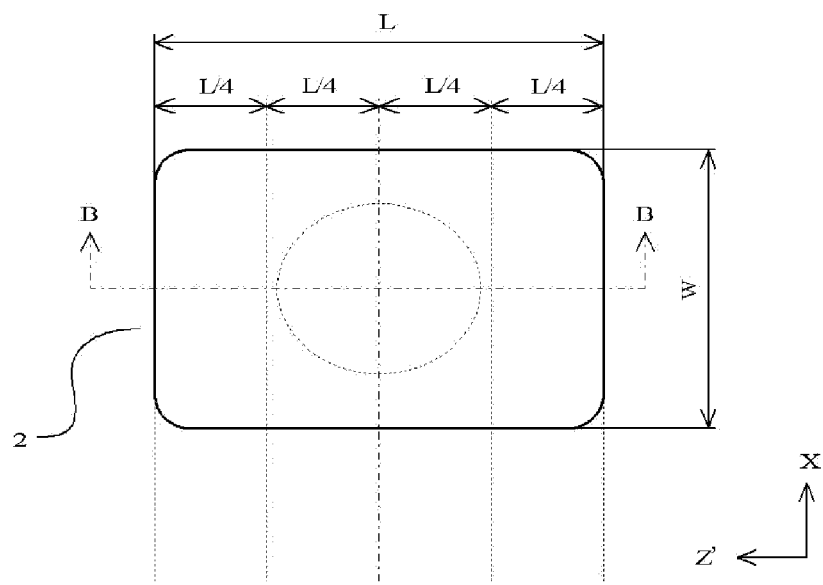
Figure 11:
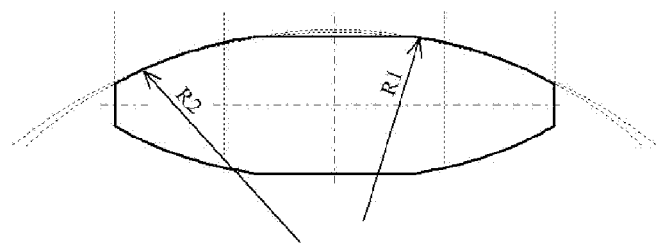

Firstly, the quartz plate according to the invention has a bevel shape having two different curvatures as illustrated in FIGS. 11a and 11b. FIG. 11a is a plan view of the bevel-shaped quartz plate according to the invention. FIG. 11b is a sectional view of the illustration of FIG. 11a cut along Line B-B. The quartz plate 2 has a first curvature radius R1 in regions by ¼L from a ½L position at the center toward the ends of the long sides (first regions), where the lengths of long sides of the quartz plate 2 are L. Further, the quartz plate 2 has a second curvature radius R2 in regions between the first regions and the ends of the long sides, more specifically, regions inward by ¼L from the ends toward the center of the long sides (second regions). According to the exemplary embodiment, R1 is equal to or larger than 26 mm and equal to or smaller than 27 mm, and R2 is equal to or larger than 7.9 mm and equal to or smaller than 8.9 mm.

Figure 12:
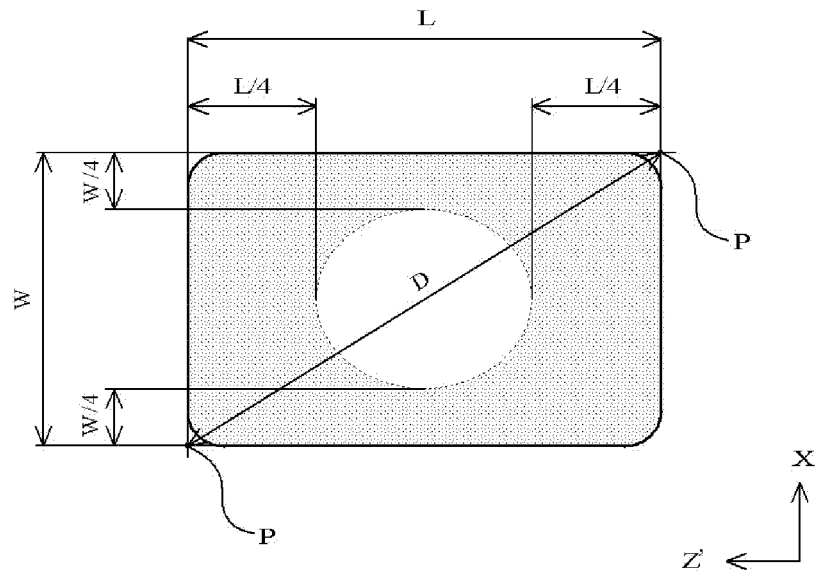
FIG. 12 is a plan view of the quartz plate according to the invention.
Figure 13:
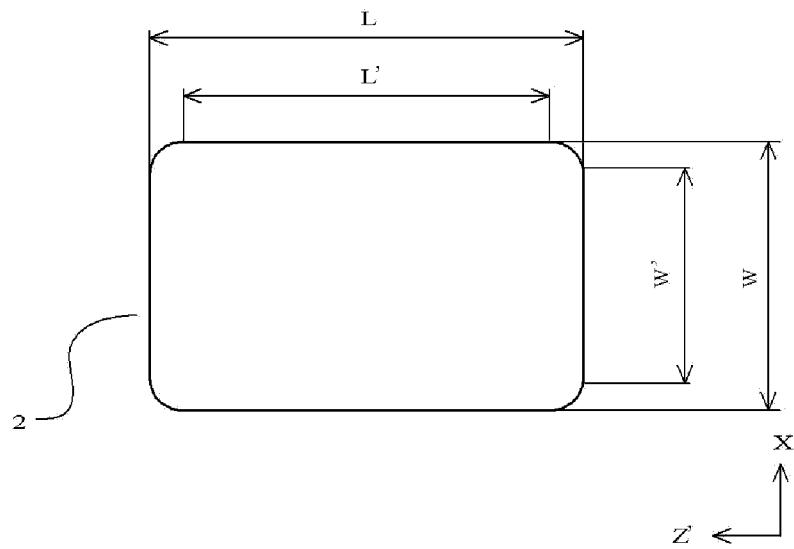
FIG. 13 is a plan view of the quartz plate according to the invention.

Secondly, a region of the quartz plate according to the invention to be thinned by the beveling work (region to be thinner by equal to or larger than 0.05 mm than the before beveling quartz plate) is a region painted with dots illustrated in FIG. 12. As to the direction of long sides, regions inward by ¼L from the ends of the short sides toward the center of the quartz plate are to be thinned, where L is the lengths of long sides. As to the direction of short sides, regions inward by ¼W from the ends of the long sides toward the center of the quartz plate are to be thinned, where W is the lengths of short sides. As to directions of diagonal lines, regions inward by ⅜D from two virtual points P and P (P and P are before beveling corner portions to be later cut off by the beveling work) toward the center of the quartz plate are to be thinned, where D is the lengths of the diagonal lines (lines each connecting the two virtual points P and P diagonally opposite to each other).

A third point is a ratio of the side lengths (long sides, short sides) to a side length in total (long sides, short sides) after the beveling work from which the portions having corner curvatures after the beveling work have been removed. As to the long sides, L'/L is equal to or larger than 0.45 and equal to or smaller than 0.5, where L' is the side lengths excluding regions having curvatures after the beveling work, and L is the side lengths including the curvatures after the beveling work. As to the short sides, W'/W is equal to or larger than 0.27 and equal to or smaller than 0.34, where W' is the side lengths excluding regions having curvatures after the beveling work, and W is the side lengths including the curvatures after the beveling work. The four corner portions have curvature radiuses equal to or larger than 0.55 mm and equal to or smaller than 0.6 mm.

Figure 14:
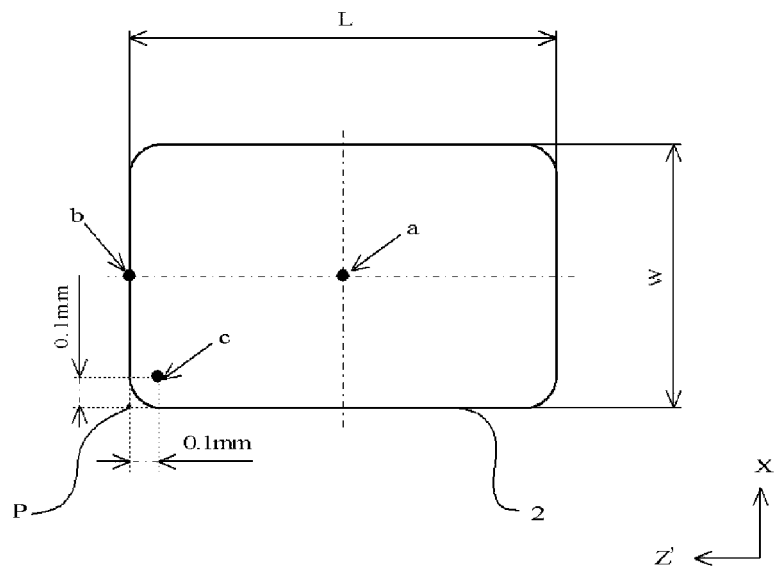
FIG. 14 is a plan view of the quartz plate according to the invention.

Fourthly, a center thickness of the after beveling quartz plate rectangular in planar view and thicknesses at positions illustrated in FIG. 14 have a relationship; b/a is equal to or larger than 0.62 and equal to or smaller than 0.79, where a is the center thickness of the quartz plate rectangular in planar view and b is center thicknesses at short-side end portions, and c/a is equal to or larger than 0.29 and equal to or smaller than 0.37, where virtual points P are corner portions of the before beveling quartz plate, and c is a thickness at an intersecting point of perpendiculars drawn from points distant by 0.1 mm from the points P toward the long sides and short sides.

According to the invention, when the quartz plate is subjected to the beveling work so that at least the frequency difference between the primary vibration and the second sub-vibration is equal to or larger than 975 kHz and equal to or smaller than 1,015 kHz, favorable series resistance values and remarkable frequency-temperature characteristics can be accomplished in the quartz resonator where the after beveling quartz plate is used because a particular shape of the quartz plate having favorable characteristics can be reliably reproduced by focusing on the second sub-vibration having a better stability. This technical advantage is described referring to FIGS. 15 to 19.

FIGS. 15 to 19 are graphical illustrations of frequency-temperature characteristics and series resistance-temperature characteristics of the quartz resonator according to the invention. The quartz plates used in the measurements illustrated in FIGS. 15 to 19 had the following outer dimensions prior to the beveling work; 2.220 mm on long sides (Z' axis) and 1.620 mm on short sides (X axis). On front and back surfaces of the after beveling quartz plate are formed rectangular driving electrodes (1.3 mm in length×1.1 in width). In the measurements were used 150 quartz resonators. Focusing on the second sub-vibration (F2), the quartz plates used as samples were classified into three groups depending on the frequency differences between the primary vibrations and second sub-vibrations thereof, and quartz resonators were produced by each of the classified groups.

Figure 15:
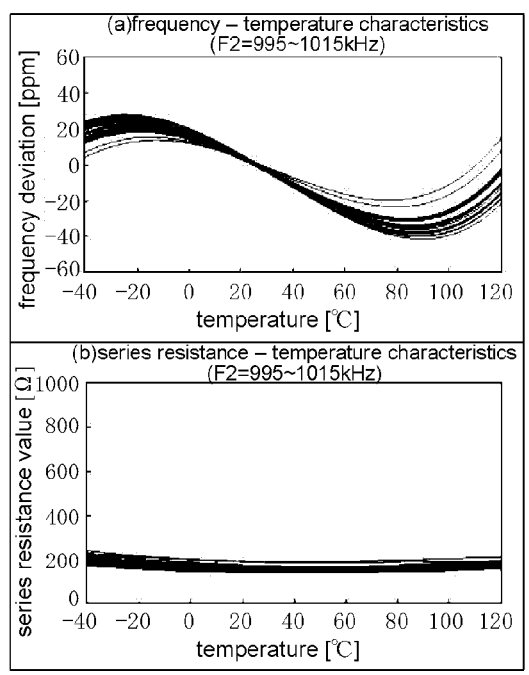
FIG. 15 is a graphical illustration of frequency-temperature characteristics and series resistance-temperature characteristics of the quartz resonator according to the invention.

FIG. 15 illustrates frequency-temperature characteristics (a: graphical illustration of a frequency deviation at each temperature) and series resistance-temperature characteristics (b: graphical illustration of a series resistance value at each temperature) under the beveling conditions; 1,005 kHz is a target frequency difference between the primary vibration and the second sub-vibration, and a manufacturing variability of ±10 kHz is taken into account.

Figure 16:
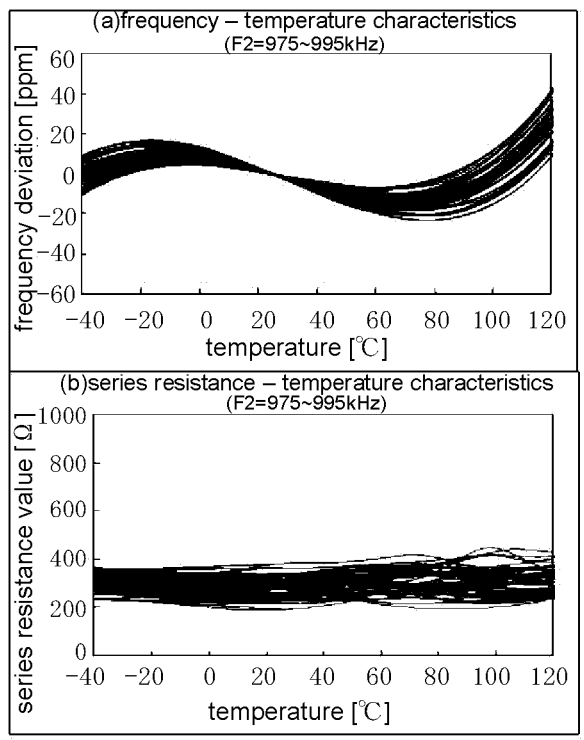
FIG. 16 is a graphical illustration of frequency-temperature characteristics and series resistance-temperature characteristics of the quartz resonator.
Figure 17:
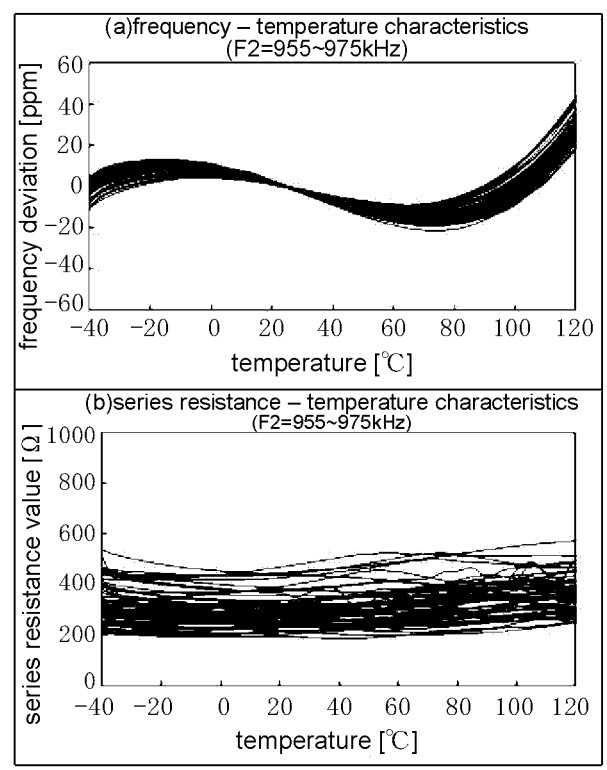
FIG. 17 is a graphical illustration of frequency-temperature characteristics and series resistance-temperature characteristics of the quartz resonator.

FIGS. 16 and 17 illustrate frequency-temperature characteristics and series resistance-temperature characteristics where the frequency difference between the primary vibration and the second sub-vibration is smaller than 1,005 kHz±10 kHz.

More specifically, FIG. 16 illustrates frequency-temperature characteristics a) and series resistance-temperature characteristics b) where 985 kHz (±10 kHz) is a target frequency difference between the primary vibration and the second sub-vibration, and FIG. 17 illustrates frequency-temperature characteristics a) and series resistance-temperature characteristics b) where 965 kHz (±10 kHz) is a target frequency difference between the primary vibration and the second sub-vibration.

As the frequency difference between the primary vibration and the second sub-vibration is smaller than 1,005 kHz±10 kHz, the series resistance-temperature characteristics are more variable.

Figure 18:
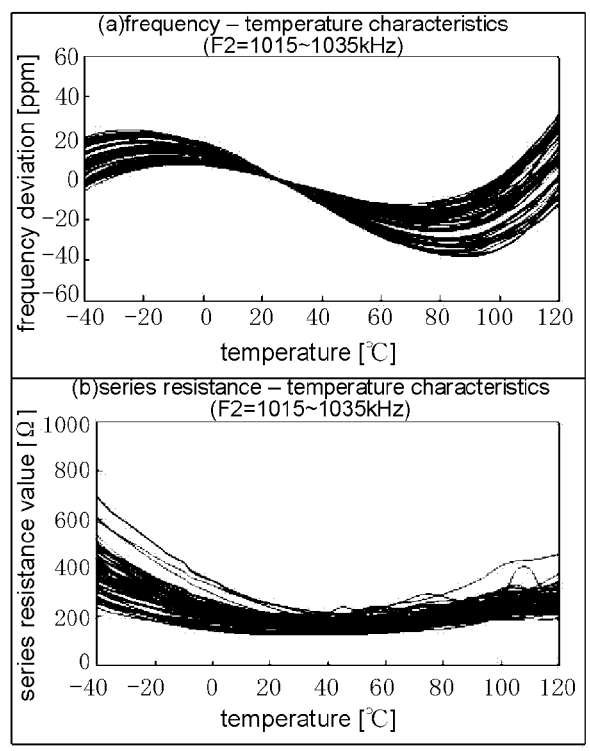
FIG. 18 is a graphical illustration of frequency-temperature characteristics and series resistance-temperature characteristics of the quartz resonator.
Figure 19:
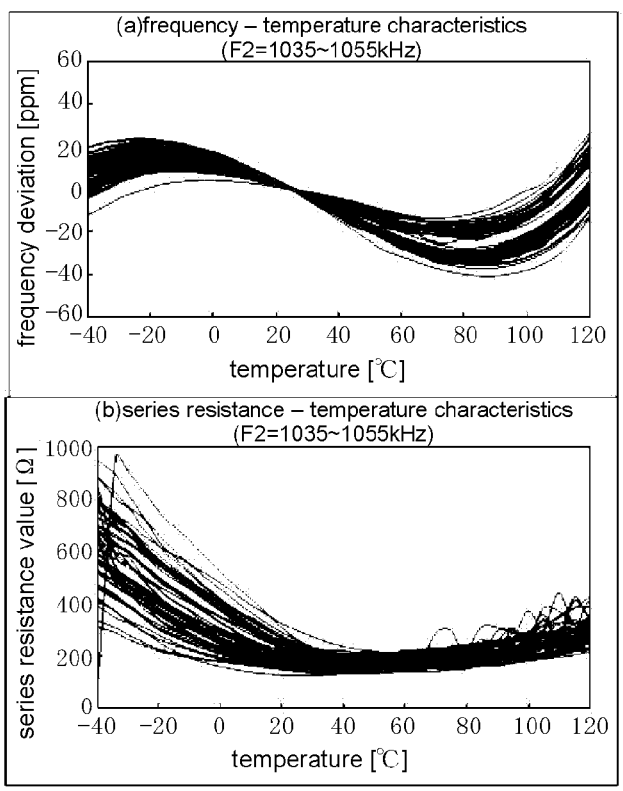
FIG. 19 is a graphical illustration of frequency-temperature characteristics and series resistance-temperature characteristics of the quartz resonator.

FIGS. 18 and 19 illustrate frequency-temperature characteristics and series resistance-temperature characteristics where the frequency difference between the primary vibration and the second sub-vibration is larger than 1,005 kHz±10 kHz. More specifically, FIG. 18 illustrates frequency-temperature characteristics a) and series resistance-temperature characteristics b) where 1,025 kHz (±10 kHz) is a target frequency difference between the primary vibration and the second sub-vibration, and FIG. 19 illustrates frequency-temperature characteristics a) and series resistance-temperature characteristics b) where 1,045 kHz (±10 kHz) is a target frequency difference between the primary vibration and the second sub-vibration. As the frequency difference between the primary vibration and the second sub-vibration is larger than 1,005 kHz±10 kHz, the series resistance-temperature characteristics are more variable and even more variable particularly in the temperature range from −40° C. to +20° C.

Comparing the graphical illustrations regarding the frequency-temperature characteristics, there is the least variability of frequency deviation where the frequency difference between the primary vibration and the second sub-vibration is 1,005 kHz as illustrated in FIG. 15. Comparing the graphical illustrations regarding the series resistance-temperature characteristics, an absolute value of the series resistance values is smaller, and the series resistance values are less variable to temperature changes where the frequency difference between the primary vibration and the second sub-vibration is 1,005 kHz.

As described so far, when the quartz plate is subjected to the beveling work so that the frequency difference between the primary vibration and the second sub-vibration is equal to or larger than 975 kHz and equal to or smaller than 1,015 kHz, a quartz resonator having favorable series resistance-temperature characteristics and remarkable frequency-temperature characteristics can be successfully obtained.

Though the illustration of FIG. 16, wherein 985 kHz (±10 kHz) is a target frequency difference between the primary vibration and the second sub-vibration, is acceptable in practical use, the illustration of FIG. 15, wherein 1,005 kHz is a target frequency difference between the primary vibration and the second sub-vibration, is preferably chosen in view of a better safety in the series resistance values.

Figure 20:
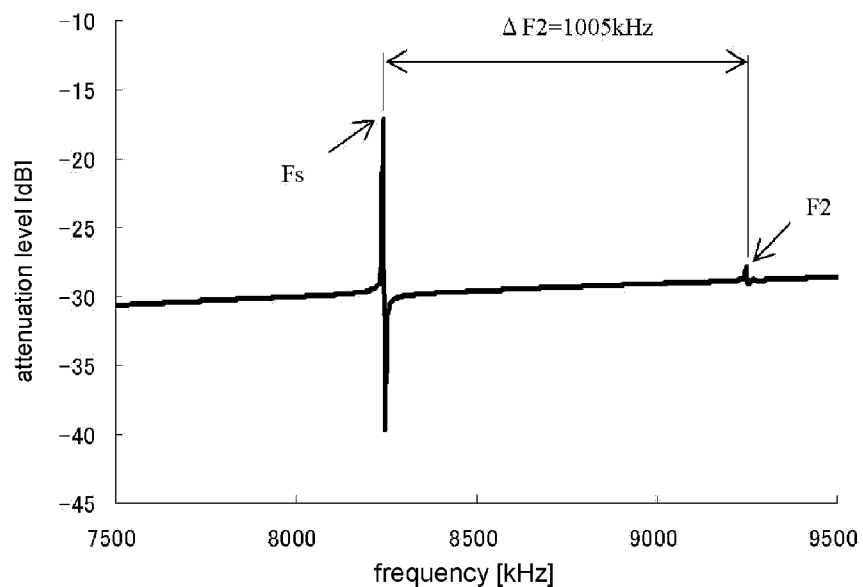
FIG. 20 is a graphical illustration of a relationship between primary vibration and sub-vibration of the quartz plate according to the exemplary embodiment.
Figure 21:
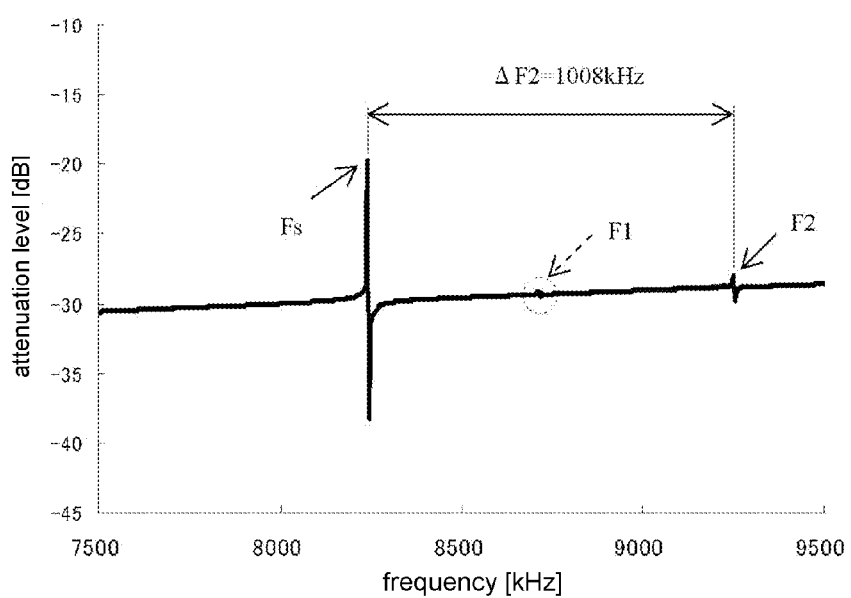
FIG. 21 is a graphical illustration of the relationship between primary vibration and sub-vibration of the quartz plate according to the exemplary embodiment.

FIGS. 20 and 21 are graphical illustrations of an actual relationship between the primary vibration and the sub-vibration of the after beveling quartz plate. In the illustration of FIG. 20, the second sub-vibration (F2) is recognizably present away by 1,005 kHz from the primary vibration (Fs), however, the first sub-vibration does not appear.

In the illustration of FIG. 21, the second sub-vibration (F2) is recognizably present away by 1,008 kHz from the primary vibration (Fs), however, the first sub-vibration is so inconspicuous that is hardly recognizable.

Though not illustrated in the drawings, the first sub-vibration is easily recognizable but the second sub-vibration is very inconspicuous or does not appear at all in some cases.

These events result from the variability of the bevel shape of the quartz plate. According to the invention, wherein one or both of the first sub-vibration and the second sub-vibration are used as quantitative control indices, the beveling work can be monitored with a focus on one of the sub-vibrations more easily controllable depending on the ongoing beveling work. Accordingly, the shape of the quartz plate having favorable characteristics can be reliably reproduced.

Figure 22:
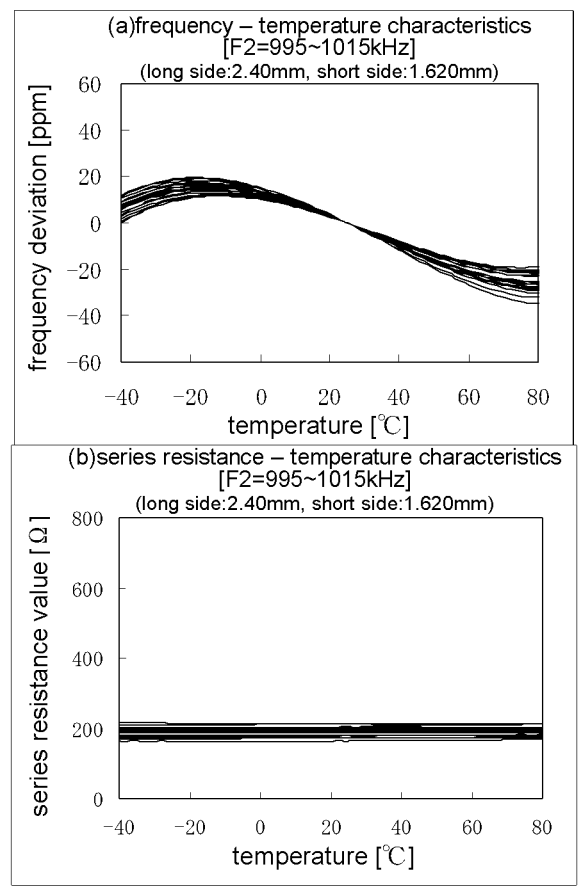
FIG. 22 is a graphical illustration of frequency-temperature characteristics and series resistance-temperature characteristics of the quartz resonator according to the invention.
Figure 23:
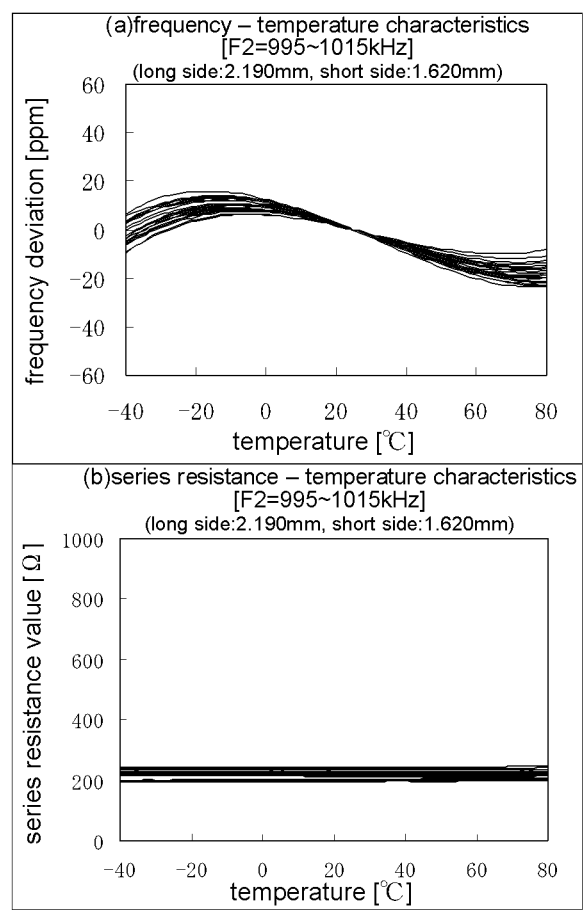
FIG. 23 is a graphical illustration of frequency-temperature characteristics and series resistance-temperature characteristics of the quartz resonator according to the invention.

FIGS. 22 and 23 are graphical illustrations of different frequency-temperature characteristics and series resistance-temperature characteristics of the quartz resonator according to the invention. FIG. 22 is a graphical illustration of frequency-temperature characteristics and series resistance-temperature characteristics of the quartz resonator according to the invention where the lengths of the short sides (X axis) are 1.620 mm and the lengths of the long sides (Z' axis) are 2.40 mm. FIG. 23 is a graphical illustration when the lengths of the long sides of the quartz plate illustrated in FIG. 22 are changed from 2.40 mm to 2.19 mm, while the lengths of the short sides thereof remain unchanged at 1.620 mm. On front and back surfaces of the after beveling quartz plate are formed rectangular driving electrodes (1.3 mm in length×1.1 mm in width). In the measurements were used 150 quartz resonators.

Describing the measurement results illustrated in FIGS. 22 and 23, a) is frequency-temperature characteristics, and b) is series resistance-temperature characteristics illustrates where the frequency difference between the primary vibration and the second sub-vibration is from 995 kHz to 1,015 kHz plus a manufacturing variability of ±10 kHz. a) is a graphical illustration of a frequency deviation at each temperature, while b) is a graphical illustration of a series resistance value at each temperature.

It is indicated by the graphs of FIGS. 22 and 23 that the quartz resonator still exhibits favorable frequency-temperature characteristics and series resistance-temperature characteristics in the case where the lengths of the short sides of the quartz plate remain unchanged at 1.620 mm but the lengths of the long sides thereof are changed from 2.40 mm to 2.19 mm.

Figure 24:
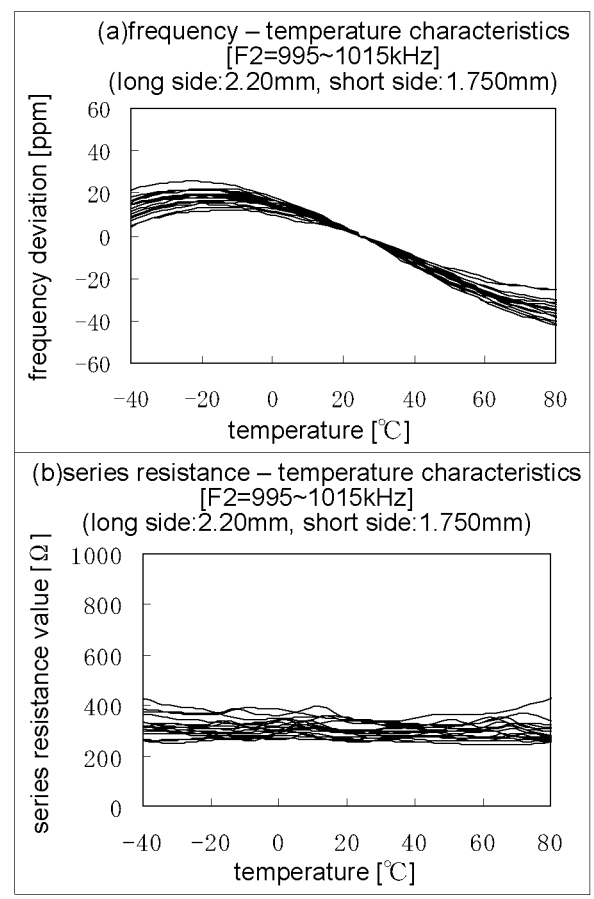
FIG. 24 is a graphical illustration of frequency-temperature characteristics and series resistance-temperature characteristics of the quartz resonator according to the invention.
Figure 25:
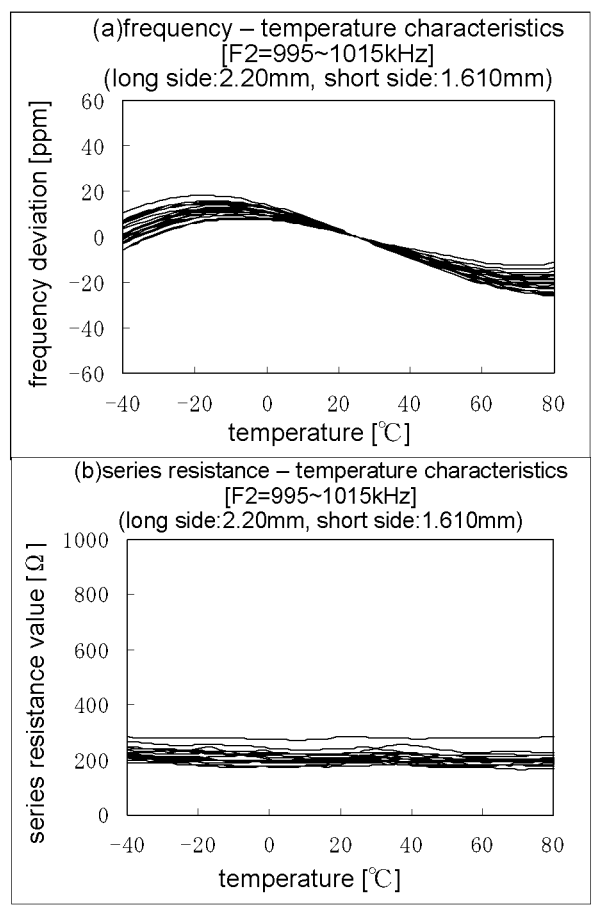
FIG. 25 is a graphical illustration of frequency-temperature characteristics and series resistance-temperature characteristics of the quartz resonator according to the invention.

FIGS. 24 and 25 are graphical illustrations of different frequency-temperature characteristics and series resistance-temperature characteristics of the quartz resonator according to the invention. FIGS. 24 and 25 are both graphical illustration of frequency-temperature characteristics and series resistance-temperature characteristics of the after beveling quartz resonator according to the invention where the lengths of the long sides of the quartz plate (Z' axis) remain unchanged at 2.2 mm but the lengths of short sides thereof (X axis) targeted in the beveling work illustrated in FIG. 24, 1.750 mm, are changed to 1.61 mm illustrated in FIG. 25. On front and back surfaces of the after beveling quartz plate are formed rectangular driving electrodes (1.3 mm in length×1.1 mm in width). In the measurements were used 150 quartz resonators.

The measurements results of FIGS. 24 and 25 illustrate frequency-temperature characteristics (a): graphical illustration of a frequency deviation at each temperature) and series resistance-temperature characteristics (b): graphical illustration of a series resistance value at each temperature) where the frequency difference between the primary vibration and the second sub-vibration is from 995 kHz to 1,015 kHz plus a manufacturing variability of ±10 kHz.

It is indicated by the graphs of FIGS. 24 and 25 that the quartz resonator still exhibits favorable frequency-temperature characteristics and series resistance-temperature characteristics in the case where the lengths of the long sides (Z' axis) of the quartz plate remain unchanged at 2.2 mm but the lengths of the long sides thereof illustrated in FIG. 24, 1.750 mm, are changed to 1.61 mm illustrated in FIG. 25 in the beveling work.

The glass material is used as the sealing material according to the exemplary embodiment. Other examples of the sealing technique are; electronic beam sealing, and laser sealing in which a brazing material, such as a silver grazing material, is used as the sealing member. Further, the invention is applicable to other surface mounting piezoelectric vibrators used in electronic devices such as quartz filters and quartz oscillators other than the surface mounting quartz resonator according to the exemplary embodiment.

While there has been described what is at present considered to be the exemplary embodiment of the invention, it will be understood that various modifications may be made therein, and the specification should not be construed to a limited extent. The scope of the invention is by no means restricted by the description of the invention but is solely restricted by the Scope of Claims. It is intended to cover in the appended claims all such modifications as fall within the true spirit and scope of this invention.

What is claimed is:

1. A quartz plate having chamfered ridge portions and an almost rectangular shape in planar view, wherein
    a resonance frequency is equal to or larger than 7 MHz and equal to or smaller than 9 MHz,
    lengths of long and short sides of the rectangular shape are equal to or larger than 1.5 mm and equal to or smaller than 2.4 mm,
    sub-vibration is present in a range of frequencies higher than a range of frequencies of primary vibration by equal to or larger than 975 kHz and equal to or smaller than 1,015 kHz, and
    in ridges of the quartz plate in a direction of side thickness thereof (Y direction), first regions by ¼L from a center of the long sides toward ends of the long sides have a shape having a first curvature radius R1 (R1 is equal to or larger than 26 mm and equal to or smaller than 27 mm), and second regions inward by ¼L from the ends of the long sides toward the center of the long sides have a shape having a second curvature radius R2 (R2 is equal to or larger than 7.9 mm and equal to or smaller than 8.9 mm), where L is the lengths of long sides of the quartz plate.

2. A quartz plate having chamfered ridge portions and an almost rectangular shape in planar view, wherein
    a resonance frequency is equal to or larger than 7 MHz and equal to or smaller than 9 MHz,
    lengths of long and short sides of the rectangular shape are equal to or larger than 1.5 mm and equal to or smaller than 2.4 mm, sub-vibration is present in a range of frequencies higher than a range of frequencies of primary vibration by equal to or larger than 975 kHz and equal to or smaller than 1.015 kHz, and b/a is equal to or larger than 0.62 and equal to or smaller than 0.79, where a is a after beveling center thickness of the quartz plate rectangular in planar view, and b is a after beveling center thicknesses at short-side portions, and c/a is equal to or larger than 0.29 and equal to or smaller than 0.37, where c is a thickness at an intersecting point of perpendiculars drawn from points distant by 0.1 mm from virtual points P, which are corner portions of the quartz plate prior to beveling, toward the long sides and the short sides.

3. A quartz plate having chamfered ridge portions and an almost rectangular shape in planar view, wherein a resonance frequency is equal to or larger than 7 MHz and equal to or smaller than 9 MHz, lengths of long and short sides of the rectangular shape are equal to or larger than 1.5 mm and equal to or smaller than 2.4 mm, sub-vibration is present in a range of frequencies higher than a range of frequencies of primary vibration by equal to or larger than 975 kHz and equal to or smaller than 1,015 kHz, regions inward by ¼L from ends of the short sides (direction of X axis) toward a center of the quartz plate and inward by ¼W from ends of the long sides toward the center of the quartz plate are to be thinned, where L is the lengths of the long sides and W is the lengths of the short sides in the rectangular shape of the quartz plate in planar view, and regions inward by ⅜D from two virtual points P and P toward the center of the quartz plate are to be thinned, where the virtual points P are before beveling corner portions diagonally opposite to each other, and D is a distance between the two virtual points P.

4. A quartz plate having chamfered ridge portions and an almost rectangular shape in planar view, wherein a resonance frequency is equal to or larger than 7 MHz and equal to or smaller than 9 MHz, lengths of long and short sides of the rectangular shape are equal to or larger than 1.5 mm and equal to or smaller than 2.4 mm, sub-vibration is present in a range of frequencies higher than a range of frequencies of primary vibration by equal to or larger than 975 kHz and equal to or smaller than 1,015 kHz, L'/L is equal to or larger than 0.45 and equal to or smaller than 0.5, where L is before beveling lengths of the long sides, and L' is after beveling lengths of the long sides excluding regions having curvatures after the beveling work, and W'/W is equal to or larger than 0.27 and equal to or smaller than 0.34, where W is before beveling lengths of the short sides, and W' is after beveling lengths of the short sides excluding regions having curvatures after the beveling work in four corner portions of the quartz plate rectangular in planar view, and curvature radiuses of the four corner portions are equal to or larger than 0.55 mm and equal to or smaller than 0.6 mm.

5. A quartz resonator including the quartz plate as in any one of claims 1, 3, 4, and 2, wherein driving electrodes and connection electrodes led out from the driving electrodes toward at least one end side of the quartz plate are formed on front and back surfaces of the quartz plate, and the quartz resonator is housed in the container so that the connection electrodes are bonded to mounting electrodes of the container in an electrically conductive manner.

6. The quartz plate as in any one of claims 1, 3, 4 and 2, wherein the sub-vibration is present in a range of frequencies higher than a range of frequencies of primary vibration by equal to or larger than 995 kHz and equal to or smaller than 1,015 kHz.

7. The quartz plate as in any one of claims 1, 3, 4 and 2, wherein the long sides of the quartz plate are set in a direction of Z' axis thereof and the short sides of the quartz plate are set in a direction of X axis thereof.

8. The quartz plate as in any one of claims 1, 3, 4 and 2, wherein the lengths of the long sides of the quartz plate are equal to or larger than 2.1 mm and equal to or smaller than 2.4 mm, and the lengths of the short sides of the quartz plate are equal to or larger than 1.5 mm and equal to or smaller than 1.75 mm.

9. The quartz plate as claimed in claim 8, wherein the lengths of the short sides of the quartz plate are equal to or larger than 1.61 mm and equal to or smaller than 1.75 mm.

\* \* \* \* \*